(12) United States Patent
Street et al.

(10) Patent No.: US 6,710,370 B2
(45) Date of Patent: Mar. 23, 2004

(54) IMAGE SENSOR WITH PERFORMANCE ENHANCING STRUCTURES

(75) Inventors: Robert A. Street, Palo Alto, CA (US); James B. Boyce, Los Altos, CA (US); John C. Knights, Soquel, CA (US)

(73) Assignee: Xerox Corporation, Stamford, CT (US)

( * ) Notice: Subject to any disclaimer, the term of this patent is extended or adjusted under 35 U.S.C. 154(b) by 101 days.

(21) Appl. No.: 10/042,090

(22) Filed: Jan. 7, 2002

(65) Prior Publication Data

US 2003/0127647 A1 Jul. 10, 2003

(51) Int. Cl.[7] .............................................. H01L 29/04
(52) U.S. Cl. ...................... 257/59; 257/448; 257/458; 257/459; 257/461
(58) Field of Search ................................ 257/448, 458, 257/459, 461, 656; 250/370.09

(56) References Cited

U.S. PATENT DOCUMENTS

| | | | |
|---|---|---|---|
| 5,043,582 A | * 8/1991 | Cox et al. | 250/370.09 |
| 5,619,033 A | 4/1997 | Weisfield | |
| 6,054,746 A | * 4/2000 | Bird et al. | 257/458 |
| 6,288,435 B1 | * 9/2001 | Mei et al. | 257/458 |

OTHER PUBLICATIONS

Article entitled: "Two Dimensional Amorphous Silicon Image Sensor Arrays", Street et al., Mat. Res. Soc. Symp. Proc. vol. 377, 1995 Materials Research Society, pp. 757–766.

Aritcle entitled: "Image Sensors In RFA Technology—Status and Future Trends", Bohm et al., Mat. Res. Soc. Symp. Proc. vol. 507, 1998 Materials Research Society, pp. 327–338.

\* cited by examiner

*Primary Examiner*—David Nelms
*Assistant Examiner*—Mai-Huong Tran
(74) *Attorney, Agent, or Firm*—Bever, Hoffman & Harms, LLP; Patrick T. Bever

(57) ABSTRACT

An image sensor is disclosed including passivation walls extending above the pixel contact pads into a photosensor layer (e.g., amorphous silicon) such that the pixel contact pads are isolated to reduce cross-talk. The passivation walls are formed from $SiO_2$ or SiON to further reduce cross-talk. An embodiment includes metal structures provided under interface regions (e.g., under the passivation walls) separating adjacent pixels that are negatively biased to prevent cross-talk, and optionally extend under the contact pad to increase pixel capacitance. One embodiment omits p-type dopant from the lower amorphous silicon photodiode layer, and additional photodiode material layers are disclosed. Another disclosed sensor structure utilizes a textured surface to increase light absorption. A color filter structure for image sensors is also disclosed.

16 Claims, 6 Drawing Sheets

IMAGE SENSOR WITH PERFORMANCE ENHANCING STRUCTURES

FIELD OF THE INVENTION

This invention relates to image sensors, and in particular to image sensors utilizing continuous photodiode layers formed over pixel access and control structures.

BACKGROUND OF THE INVENTION

Solid state image sensors used in, for example, video cameras are presently realized in a number of forms including charge coupled devices (CCDs) and CMOS image sensors. These image sensors are based on a two dimensional array of pixels. Each pixel includes a sensing element that is capable of converting a portion of an optical image into an electronic signal. These electronic signals are then used to regenerate the optical image on, for example, a liquid crystal display (LCD) or cathode-ray tube (CRT) display.

CMOS image sensors first appeared in 1967. However, CCDs have generally prevailed since their invention in 1970. Both CMOS and CCD solid-state imaging sensors depend on the electrical response that results when silicon is exposed to light. Photons in the visible and near-IR regions of the spectrum have sufficient energy to create free carriers in silicon. The number of electrons released is proportional to the light intensity. Even though both technologies use the same general physical properties, all-analog CCDs dominate vision applications because of their superior dynamic range, low fixed-pattern noise (FPN), and high sensitivity to light.

More recently, however, CMOS image sensors have gained in popularity. CMOS image sensors have benefited from advances in CMOS technology such that they provide several advantages over CCD imagers. Shrinking lithography and advanced signal-processing algorithms set the stage for sensor array, array control, and image processing on one chip produced using well-established CMOS techniques. Typically, the sensor array is formed in a selected region of the chip, and the array control and image processing circuitry is formed around the sensor array. Each CMOS image sensor pixel of a sensor array includes a light sensor formed by diffusing an n-type dopant into a selected region of the silicon chip substrate, and also forming one or more FET switches and an amplifier, along with associated addressing lines, along the perimeter of the diffused light sensor. All of these elements are formed using the same CMOS technology utilized to form the control and image processing circuitry. A typical CMOS pixel size is 5–15 microns, and requires lower bias voltages than that required for CCD image sensors. Therefore, by integrating the sensor array, control and image processing on a single chip and utilizing lower bias voltages, CMOS image sensors are typically lower in cost and power consumption than CCD image sensors.

However, conventional CMOS image sensors that include light-sensing elements (photodiodes) formed in a silicon substrate have some technical disadvantages. In particular, the use of the silicon substrate to form the light-sensing element typically requires the formation of access transistors, metal signal lines, and other structures around the perimeter of the light-sensing element. This reduces the sensitivity because a significant portion of the substrate is screened by the metal lines and other elements, and therefore cannot be used to form light-sensing elements. In addition, the long diffusion length of carriers in the silicon substrate causes cross-talk between adjacent pixels giving reduced spatial resolution.

CMOS image sensors that are fabricated using Thin Film on ASIC (TFA) technology were recently introduced that provide enhanced performance over conventional CMOS image sensors. TFA-type CMOS sensors includes a light sensitive (sensor) material, such as amorphous silicon (a-Si:H), deposited on top of the pixel array (i.e., the access transistors and metal signal lines), thereby increasing the area that can be utilized for light detection by positioning the pixel electronics below the photodiode (sensor) material. The light sensitive material layer is sandwiched between a transparent continuous bias layer (e.g., indium-tin oxide (ITO)) and discrete contact pads (i.e., metal electrodes) associated with each pixel of the array. The contact pad of each pixel is connected to the pixel electronic circuit (e.g., amplifier and one or more access/reset transistors). During operation a bias voltage is applied to the sensor material by the continuous bias layer to create a potential between the continuous bias layer and the individual pixel contact pads through the light sensitive material. Light passing into the light sensitive material frees electrons that generate a current between the pixel contact pad and the continuous bias layer, thereby changing the charge stored on the pixel contact pad. The access transistor of each pixel is periodically turned on to transfer the signal developed in the pixel to the single processor electronics positioned around the array. The signal that is transferred is proportional to the change in charge existing on the pixel contact pad, which in turn is proportional to the amount of light striking the sensor material above that pixel. The benefit of the TFA-type CMOS sensor is that virtually the whole pixel area is light sensitive, and the carrier diffusion and device interaction in the illuminated substrate is eliminated. This structure for the pixel is essentially the same as is used on a-Si:H large area arrays, using the so-called "high fill factor approach", in which a continuous a-Si:H photodiode is placed on top of the addressing electronics (e.g. R. A. Street et al, MRS Symp. Proc. Vol 377, 757, 1995; see also co-owned U.S. Pat. No. 5,619,033 to Richard Weisfield, entitled "Layered Solid State Photodiode Sensor Array"). CMOS sensors containing a-Si:H photodiodes have been described by Bohm et al. (e.g. MRS Symp. Proc. Vol 507, 327, 1998).

Although TFA-type CMOS image sensors provide significant advantages over conventional, substrate-based photodiode sensors, additional improvements are needed to optimize image sensor performance. For example, due to the continuous sensor material layer utilized in TFA-type sensors, signal leakage between adjacent pixels is a significant problem that reduces sensor spatial resolution. Further, the sensitivity of TFA-type CMOS image sensors is reduced by reflection of light from the ITO biasing layer, or by light passing through the sensor material without generating any current (i.e., without interacting with the sensor material to free electrons).

Accordingly, what is needed is a TFA-type CMOS image sensor with reduced cross-talk and/or improved light absorption.

SUMMARY OF THE INVENTION

The present invention is directed to structural modifications to a TFA-type image sensor array (e.g., a CMOS image sensor array) that facilitate enhanced performance by reducing cross-talk between adjacent pixels, and/or by modifying the light receiving structure of the image sensor to increase light absorption.

In accordance with an embodiment of the present invention, an image sensor array includes a plurality of pixel circuits arranged in rows and columns, each pixel circuit including a continuous sensor layer formed over an array of pixel contact pads, each pixel contact pad being connected by associated pixel circuitry that selectively transfers a charge from the pixel contact pad to an associated data line in response to a control signal transmitted on an associated gate line. The pixel circuitry typically includes an access field effect transistor (FET) controlled by an associated gate line, and an amplifier (e.g., a source follower) connected between the pixel contact and the access transistor. The gate lines are controlled by a scanning control circuit and are arranged such that each gate line controls one row of pixels. The data lines are arranged such that each data line transfers charge from one column of pixels to readout circuitry.

In accordance with a first aspect of the present invention, a series of crisscrossing walls are patterned into an upper passivation layer such that an array of trenches are defined therein. The contact pad of each pixel is formed in an associated trench such that an upper surface of the contact pad is located below the upper edges of the four wall segments surrounding the contact pad. A metal via extends through a lower portion of the passivation layer to connect the pixel contact pad to its associated pixel circuitry. By placing the pixel contact pads into trenches such that each pixel contact pad is separated from adjacent pixel contact pads by the passivation walls, the amount of cross-talk between adjacent pixel contact pads is reduced, thereby increasing image sensor resolution.

In accordance with another aspect of the present invention, an amorphous silicon photodiode layer is formed over the passivation layer such that doped lower portions of the photodiode layer extend into the trenches and are also separated by the passivation walls. The upper edges of the passivation walls define openings through which the pixel contact pads are exposed. The lower portions of the photodiode layer, which are formed on corresponding contact pads, are doped with an n-type dopant to facilitate electrical conduction from the photodiode layer to the pixel contact pad. Located above the lower portions is a continuous central region of undoped a-Si:H material, and above the central undoped region is a continuous upper p-type doped region. A transparent biasing layer (e.g., ITO) is formed over the photodiode layer. To prevent cross-talk between adjacent pixels, the passivation walls are formed such that the lower doped portions of the a-Si:H photodiode layer are located below the upper edges of the passivation walls (i.e., the passivation walls extending into the undoped central region of the photodiode layer). Further, to minimize conduction in the undoped central region of the photodiode layer (particularly along the passivation/photodiode interface), the passivation walls are formed from one of $SiO_2$ or SiON, instead of conventional Silicon-Nitride ($Si_3N_4$).

In accordance with another aspect of the present invention, a conductor is formed under the interface regions separating adjacent pixels (e.g., under the passivation walls, described above). The conductor is biased to prevent conduction between adjacent pixel contact pads. The present inventors have determined that, in some instances, the passivation and/or the undoped central region of the photodiode layer located between adjacent pixels act like the channel of a transistor to pass current from one pixel contact pad to an adjacent pixel contact pad. The metal structures placed under the interface regions separating the pixels and biased using a low or negative voltage act as a gate that turns off this effective transistor, thereby preventing leakage (cross-talk) between adjacent pixel contact pads and improving the dynamic range of the image sensor. The metal structure can also be extended under the pixel contact pad to increase the capacitance of each pixel, thereby increasing the capacitance of each pixel.

In accordance with another aspect of the present invention, alternative photodiode materials are utilized in combination with other aspects of the present invention to provide various CMOS image sensors exhibiting improved performance. In one disclosed embodiment, a novel a-Si:H photodiode structure is formed without the lower n-type doped region found in conventional a-Si:H sensors, thereby reducing the occurrence of cross-talk between adjacent pixels.

In accordance with another aspect of the present invention, a non-planar topology is provided under an a-Si:H sensor layer that increases the collection efficiency and absorption of light by the sensor layer. In particular, passivation material is etched to form an inverted, truncated pyramid having sloped walls that meet at a centrally-located primary contact structure, which is connected to an access transistor as described above. Secondary contact structures (e.g., n-type dopant and/or Chrome) are formed on the sloped walls and are connected to the primary contact structure. Formed on the secondary contact structures and primary contact structures is an a-Si:H sensor layer that conforms with the underlying topology. An ITO biasing layer is formed over the a-Si:H sensor layer, and also conforms with the underlying topology. The angle of the sloped walls is selected to increase the number of photons entering the a-Si:H sensor layer. In particular, a light ray at normal or near normal incidence to the plane of the sensor chip will be partly absorbed and partly reflected at the first point of incidence. The absorbed light generates a current between the primary/secondary contact structures and the biasing layer. The reflected light will strike the opposite side of the structure, where more absorption takes place. This reflection/absorption process repeats until the light is substantially absorbed, leading to a significantly higher fraction of the light being absorbed than in a planar structure.

In accordance with another aspect of the present invention, a color filter structure is disclosed that further enhances light absorption.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention is directed to several structural improvements for image sensors that provide an uncomplicated but reliable contact between the photodiode and pixel circuitry, that control cross-talk, that provide high light collection, and that optimize other aspects of the image sensors. The structural improvements of the present invention are described below with specific reference to CMOS image sensors, but are also believed to provide beneficial improvements when utilized in other types of image sensors (e.g., non-CMOS).

Figure 1:
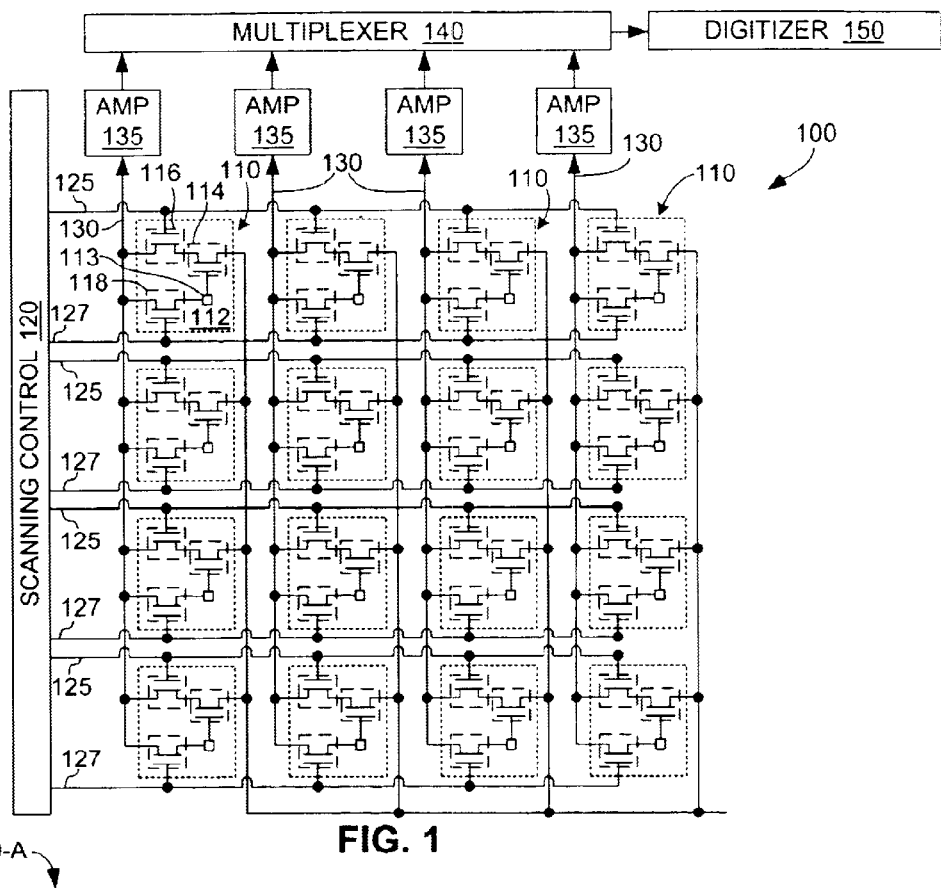
FIG. 1 is a simplified circuit diagram showing a CMOS image sensor array.
Figure 2A:
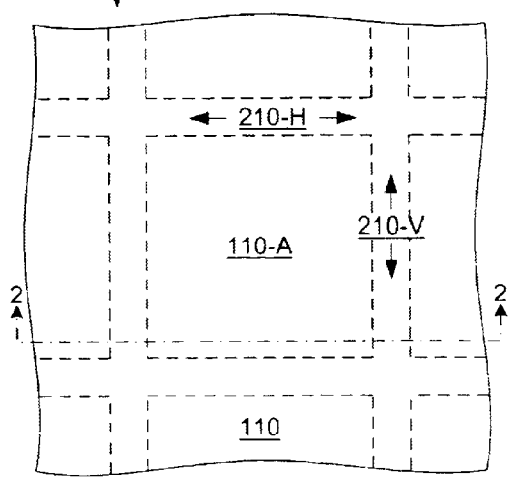
FIGS. 2(A) and 2(B) are plan and cross-sectional side views showing a CMOS image sensor pixel including pixel-isolating passivation walls according to an embodiment of the present invention.
Figure 2B:
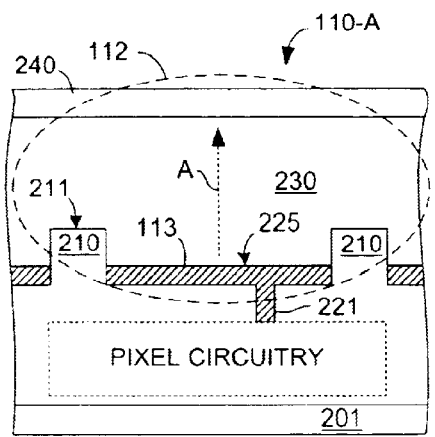
Figure 3:
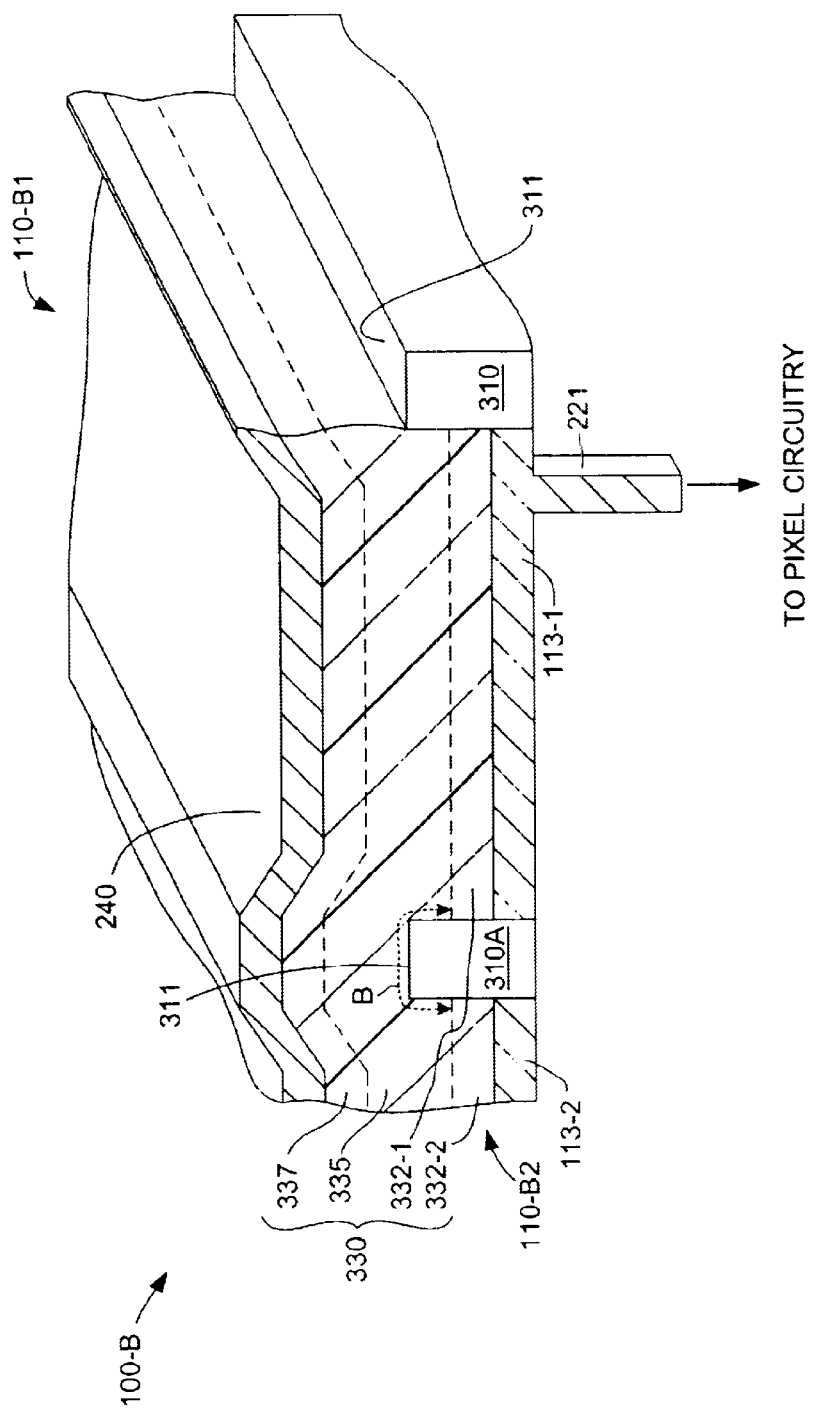
FIG. 3 is a front perspective view depicting a portion of a pixel circuit including an a-Si:H photodiode layer according to another embodiment of the present invention.
Figure 4A:
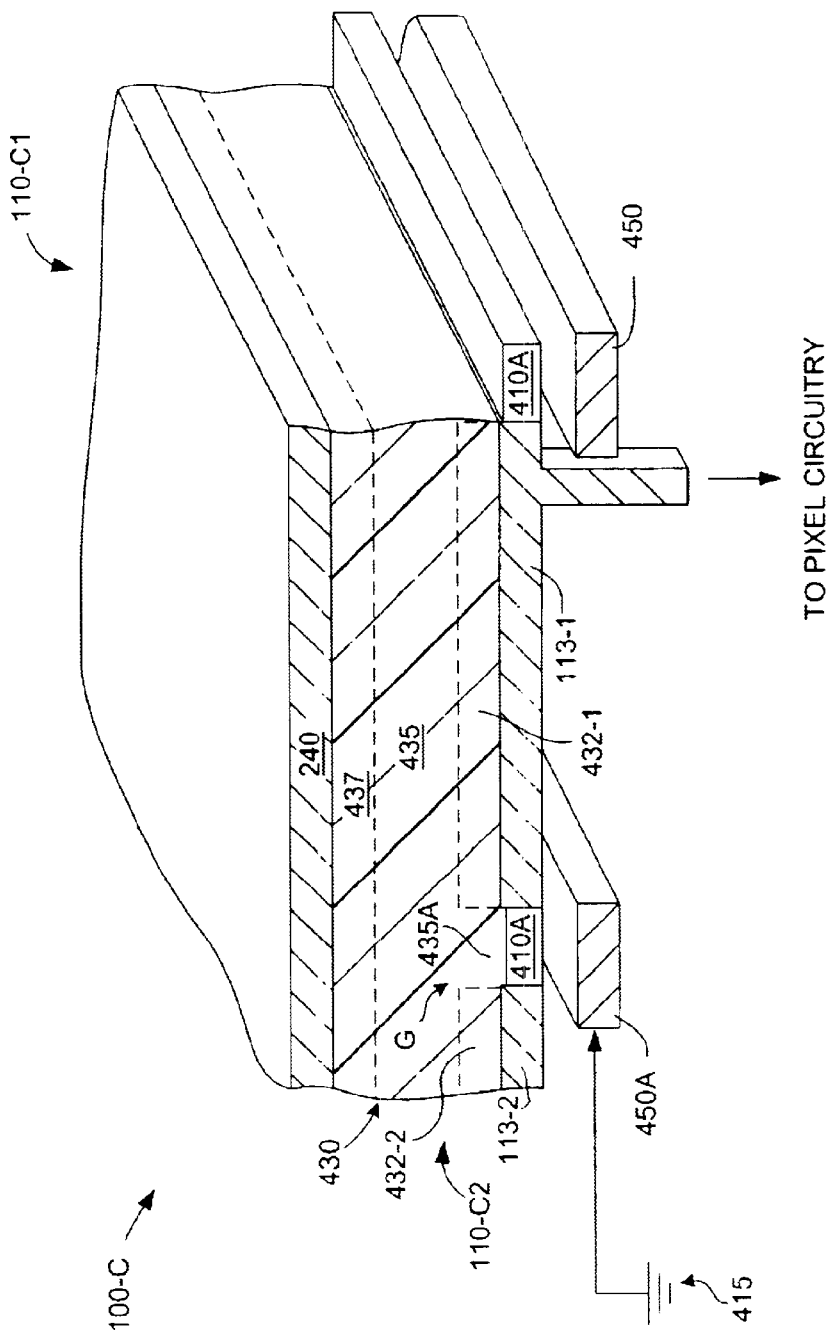
FIGS. 4(A) and 4(B) are front perspective views depicting portion of pixel circuits including alternative biasing structures located below the passivation walls according to another embodiment of the present invention.
Figure 4B:
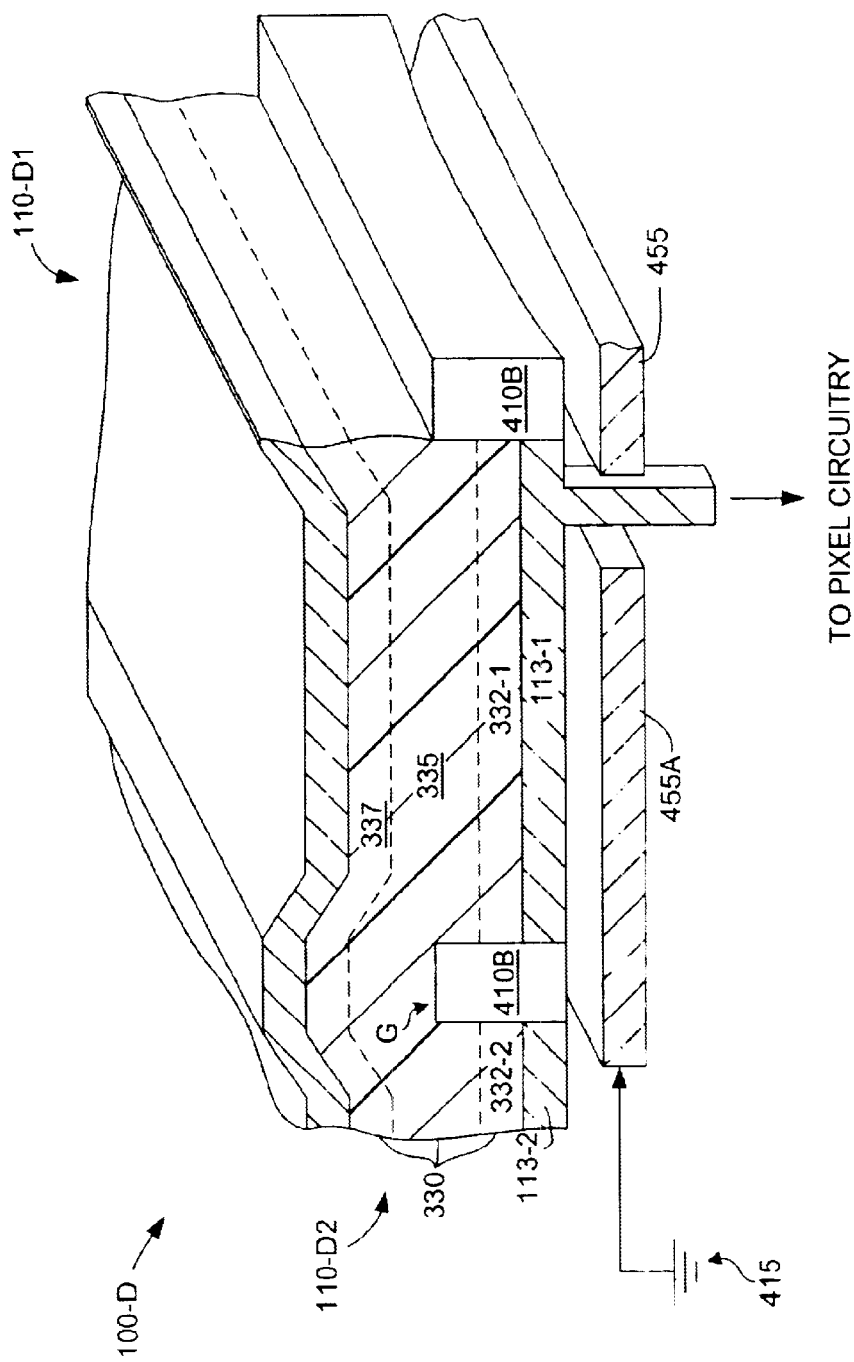
Figure 5:
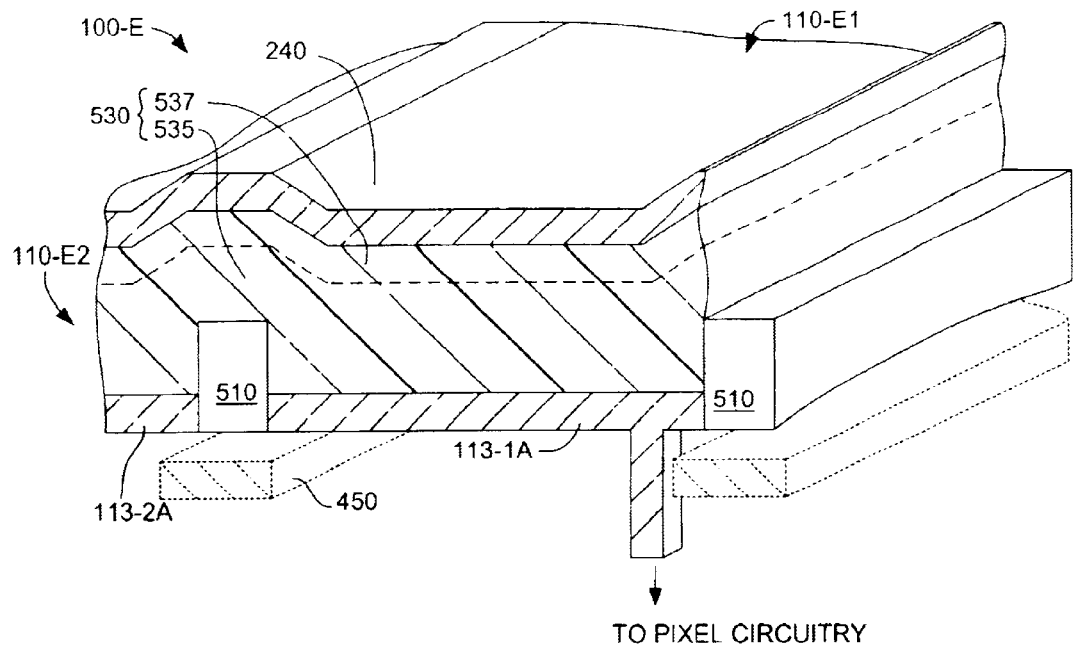
FIG. 5 is a front perspective view depicting a portion of a pixel circuit including a special a-Si:H photodiode layer according to another embodiment of the present invention.
Figure 7:
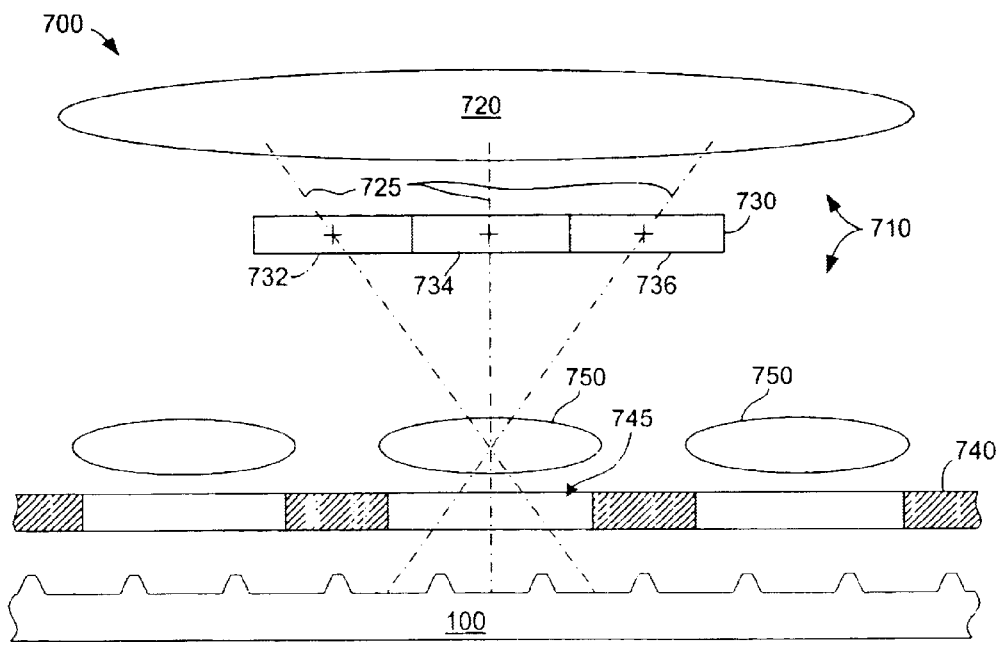
FIG. 7 is a simplified side view showing an image sensor including a color filtering structure according to another embodiment of the present invention.
Figure 6A:
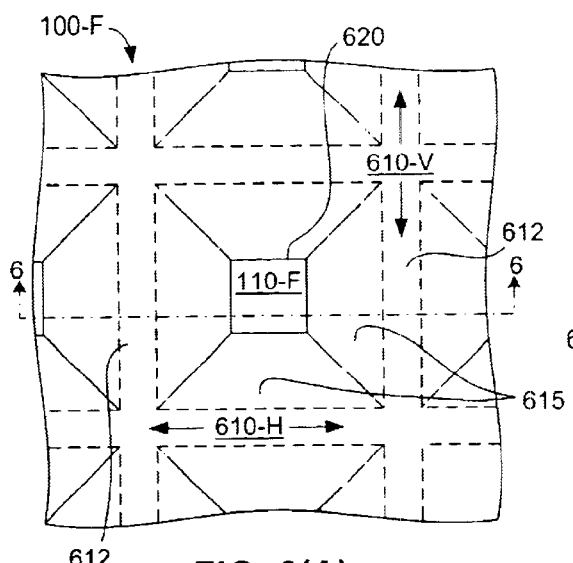
FIGS. 6(A), 6(B), and 6(C) are plan, cross-sectional side, and simplified side views showing an image sensor pixel including surface texturing according to another embodiment of the present invention.
Figure 6C:
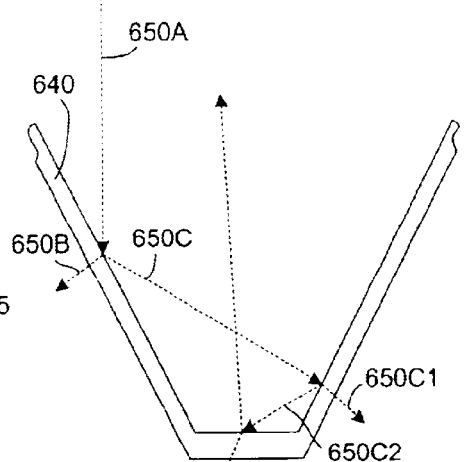
Figure 6B:
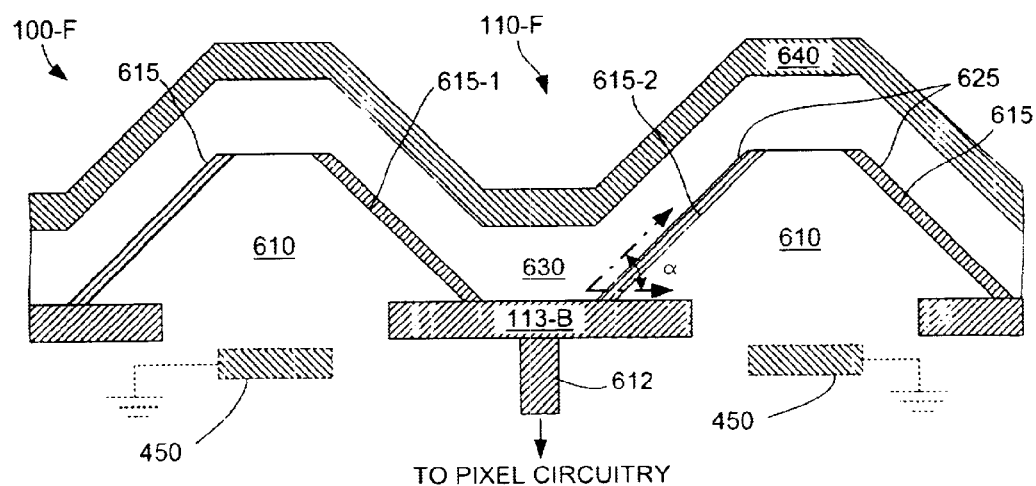

The various aspects of the present invention are described with reference to the figures. FIG. 1 shows a simplified CMOS image sensor 100. FIGS. 2(A), and 2(B) depict a generalized pixel of CMOS image sensor 100-A that includes passivation walls separating individual pixel contact pads. FIG. 3 depicts an a-Si:H CMOS image sensor 100-B in which passivation walls extend through lower n-type doping regions and are formed from one of SiO2 and SiON according to an aspect of the present invention. FIGS. 4(A) and 4(B) depict a CMOS image sensors 100-C and 100-D, respectively, that include metal structures located below the passivation walls and pixel contact pad according to additional aspects of the present invention. FIG. 5 depicts an a-Si:H CMOS image sensor 100-E in which crosstalk is reduced by eliminating the lower p-type doped region of each pixel according to another aspect of the present invention. FIGS. 6(A), 6(B), and 6(C) depict a CMOS image sensor 100-F that is textured to maximize light capture according to another aspect of the present invention. Finally, FIG. 7 depicts a simplified color filter structure formed over CMOS image sensor 100. Each of these embodiments is described in detail below.

FIG. 1 is a circuit diagram showing a simplified CMOS image sensor 100 including an array of pixels 110, each pixel 110 including a light sensor 112 having a contact pad 113 connected to an associated pixel circuit including, for example, an amplifier (e.g., a source follower) 114, an access FET 116, and a reset FET 118. Amplifier 114 is connected between contact pad 113 and access FET 116, which is connected to a corresponding data line 130. Reset FET 118 is connected between contact pad 113 and data line 130. A scanning control circuit 120 turns on access FETs 116 one row at a time during readout operations using a series of parallel gate lines 125, and also turns on reset FETs 118 during reset operations using reset lines 127. During readout operations, as each row of access FETs 116 is turned on, an image signal corresponding to the charge on the light sensors 112 is transferred to parallel data lines 130, which are respectively connected to readout circuitry 135. During reset operations, the potential at each sensor 112 is reset to begin the next readout cycle. The resulting amplified signal for each row is multiplexed by a parallel-to-serial converter or multiplexer 140, and then transmitted to an analog-to-digital converter or digitizer 150. Note that scanning control circuit 120, readout amplifiers 135, multiplexer 140, and digitizer 150 are formed using conventional CMOS techniques on the same substrate (chip) as that used to form the array of pixels 110.

FIGS. 2(A) and 2(B) are simplified plan and cross-sectional side views showing a portion of a CMOS image sensor 100-A, which represents a first embodiment of CMOS image sensor 100 (FIG. 1). In particular, FIGS. 2(A) and 2(B) show an exemplary pixel 110-A that includes a passivation layer patterned in accordance with a first aspect of the present invention. The cross-sectional view of FIG. 2(B) is generally taken along section line 2—2 of FIG. 2(A), and depicts only portions that are relevant to the present invention.

Referring to FIG. 2(A), pixels 110-A of CMOS image sensor 100-A are arranged in an array of rows and columns that are generally defined by a series of first passivation walls 210-H extending in a first lateral direction, and an intersecting series of second passivation walls 210-V extending in a second lateral direction. The length and width of each pixel 110-A is approximately 5–15 microns, depending on the application. The width of each passivation wall 210 also varies according to application, but is generally between 0.3 and 2 microns. Each pixel 110-A of CMOS image sensor 100-A is effectively isolated within the substantially square region defined by passivation walls 210-H and 210-V, which are collectively referred to below as passivation walls 210.

Referring to FIG. 2(B), pixel 110-A includes a photodiode 112 and corresponding pixel circuitry (described above with reference to FIG. 1) that are formed over a substrate 201. Photodiode 112 includes pixel contact pad 113, a region of sensor material 230 located over pixel contact pad 113, and a corresponding portion of a continuous transparent biasing layer 240. Conventional CMOS processes use up to 5 metal levels, not all of which are needed to fabricate the pixel circuitry. Hence, the top metal level of the CMOS process can be used to form pixel contact pad 113 of each pixel 110-A. Note that metal structures needed to form the pixel circuitry located under pixel contact pad 113 are formed using preceding metal layers of the CMOS process. Formed over pixel contact pad 113 is a continuous layer of sensor material 230 that is formed by an amorphous or polycrystalline material (e.g., a-Si:H). Formed on top of sensor material 230 is a transparent conductive biasing layer 240 (e.g., ITO). During operation, biasing layer 240 is maintained at a predetermined bias voltage (e.g., −5V), and a predetermined reset charge is applied to contact pad 113 through reset FET 118 (see FIG. 1), which is subsequently turned off to isolate contact pad 113. Subsequently, light passing through biasing layer 240 interacts with sensor material 230 to generate free electrons. These free electrons produce a current A between pixel contact pad 113 and biasing layer 240, thereby changing the charge on pixel contact pad 113 by an amount proportional to the amount of light "detected" by sensor material 230. During a read operation, access transistor 116 is turned on and the remaining charge on pixel contact pad 113 amplified and read out.

As mentioned above, the present inventors have determined that a problem with conventional CMOS image sensors is the leakage of current between adjacent pixel contact pads 113. In particular, when the voltage difference between the contact pads 113 of adjacent pixels is sufficiently great, a current is generated that undesirably discharges pixel contact pad 113 to the pixel contact pad of adjacent pixels, leading to image blurring or otherwise loss of spatial resolution.

In accordance with an aspect of the present invention, passivation walls 210 are formed around each pixel contact pad 113 to provide isolation between adjacent pixel contact pads in order to reduce crosstalk between the contact pads. As indicated in FIG. 2(A), passivation walls 210 have upper edges 211 that extend above an upper surface 225 of each contact pad 113 such that each set of passivation walls 210 surrounding a pixel contact pad 113 defines a trench receiving that pixel contact pad. In one embodiment, passivation walls 210 are formed when isolation trenches are patterned into a passivation layer in the same process used to form the vias to the metal contact pads. Pixel contact pads 113 are subsequently deposited and patterned in the trenches. Alternatively, after depositing and patterning the metal contact pads on a substantially planar passivation layer, passivation walls 210 can be formed by patterning subsequently deposited passivation material according to known techniques in which pixel contact pad 113 serves as an etch stop, thereby forming trenches in which an upper surface of the pixel contact pads are exposed. In either case, each pixel contact pad 113 is formed such that its upper surface 225 is located below upper edges 211 of the four passivation wall segments surrounding the contact pad. Because each pixel contact pad 113 is surrounded by passivation walls 210 and separated thereby from adjacent pixel contact pads, the amount of cross-talk between adjacent pixel contact pads is reduced, thereby increasing image sensor resolution.

FIG. 3 is a perspective view showing a portion of a CMOS image sensor array 100-B, which represents a second embodiment of CMOS image sensor 100 (FIG. 1). CMOS image sensor array 100-B includes a pixel 110-B1 and an adjacent pixel 110-B2 (partially shown). Image sensor array 100-B is similar to the generalized sensor array 100-A (shown in FIGS. 2(A) and 2(B)) in that it includes a series of passivation walls 310, including passivation wall 310A that separates pixel 110-B1 and 110-B2. In addition, CMOS image sensor array 100-B specifically includes an a-Si:H layer 330 having a p-i-n photodiode structure including separate lower n+ doped regions 332-1 and 332-2, a continuous central undoped ("i") region 335, and a continuous upper p+ doped region 337, all of which are formed in accordance with known techniques. Note that each lower n+ doped region 332-1 and 332-2 is formed on a corresponding metal contact pad 113-1 and 113-2, respectively. Other structural elements of CMOS image sensor array 100-B that are essentially identical to corresponding elements of the embodiments described above are identified with like reference numbers, and detailed description of these elements is omitted for brevity.

When a-Si:H photodiode structures having the p-i-n structure of layer 330 are used in an image sensor, the bottom n+ region associated with each pixel must be isolated from the neighboring pixel to avoid cross-talk. Referring to FIG. 3, note that passivation walls 310 extend into central undoped region 335 (e.g., upper surfaces 311 of passivation wall 310A is located above n+ doped portions 332-1 and 332-2, and extends into central undoped region 335). Accordingly, portions of passivation walls 310 are provided between each adjacent lower n-type doped region, thereby providing the necessary isolation. This isolation can be generated using known patterning techniques, but can also be achieved in other ways. For example, an n+ layer can be deposited over a passivation layer that has reentrant trenches patterned between the pixels. The thin n+ layer will not totally cover these trenches, thereby forming regions 332 that are isolated from neighboring pixels without an additional lithography step for patterning the n+ layer. These isolation trenches can be patterned into the passivation layer at the same time the contact vias (e.g., via 221) are patterned.

Even though adjacent pixels 110-B1 and 110-B2 are separated by passivation wall 310A, the present inventors have determined that some signal cross-talk occurs due to conduction (indicated by arrow B) in undoped region 335 of a-Si:H layer 330. Through experimentation on large area arrays, the present inventors have determined that this lateral conduction occurs predominately at the interface between the undoped regions 335 and passivation wall 310A (e.g., along upper surface 311 of passivation walls 310A). It was further determined that leakage is most significant when this interface includes an electron accumulation layer.

In accordance with another aspect of the present invention, to minimize leakage around passivation walls 310 between adjacent pixels 110-B1 and 110-B2, passivation walls 310 are formed from one of $SiO_2$, and SiON, and benzocyclobutene (BCB), instead of the conventionally-used Silicon-Nitride. The present inventors have determined through experimentation that $SiO_2$ and SiON have lower leakage than Silicon-Nitride, and believe this is due to the interface states and/or work functions of these materials, which are believed to cause charge bending at the interface, which reduces the number of accumulated electrons.

FIGS. 4(A) and 4(B) are perspective views showing portions of CMOS image sensor arrays 100-C and 100-D, which represent a third and fourth embodiments of CMOS image sensor 100 (FIG. 1). Image sensor arrays 100-C and 100-D include adjacent pixels that are substantially isolated from each other by regions, which are generally referred to herein as elongatged interface regions, that include passivation or insulation material and/or regions of intrinsic (undoped) sensor material. In addition, similar to image sensor arrays described above, CMOS image sensor arrays 100-C and 100-D include a continuous sensor layer (e.g., a-Si:H) that is sandwiched between a biasing layer 240 and pixel contact pads 113-1 and 113-2 of the adjacent pixels. Other elements of image sensor arrays 100-C and 100-D that are essentially identical to those of the embodiments described above are identified with like reference numbers, and description of these elements is omitted for brevity.

Referring to FIG. 4(A), CMOS image sensor array 100-C includes adjacent pixels 110-C1 and 110-C2 that include contact pads 113-1 and 113-2, respectively, that are connected to associated pixel circuitry as indicated and described above. Formed over pixels 110-C1 and 110-C2 is a continuous sensor layer 430 (e.g., a-Si:H) having lower regions 432-1 and 432-2, an intrinsic (undoped) central region 435, and an upper (p-type) doped region 437. Lower regions 432-1 and 432-2 contact upper surfaces of contact pads 113-1 and 113-2, respectively, and in one embodiment are doped with an n-type dopant. Note that an interface region G of relatively non-conductive material (i.e., passivation portion 410A and/or regions 435A of intrinsic sensor material) separates first pixel 110-C1 from second pixel 110-C2.

In accordance with another aspect of the present invention, CMOS image sensor array 100-C includes a series of conductors 450A located under interface regions G (e.g., under passivation portions 410A) and biased by a fixed bias voltage 415 to provide active control of the interface between pixels 110-C1 and 110-C2. When fixed bias voltage 415 is 0V or a negative voltage with respect to pixel contact pads 113-1 and 113-2, conductor 450A actively removes electrons from the interface region between these pixel contact pads, thereby effectively causing the interface to act as a transistor that is turned off. Because the photodiode of each pixel typically uses a negative bias, it would be convenient to reset sensor contact pads 113-1 and 113-2 to the positive chip voltage (e.g., 5V), and to utilize ground as fixed bias voltage 415. In one embodiment, similar biased conductors 450 are located under each passivation wall 420 of image sensor array 100-C.

Referring to FIG. 4(B), CMOS image sensor array 100-D includes adjacent pixels 110-D1 and 110-D2 that are separated by an interface region G that includes passivation walls 410B, which are formed in a manner similar to that described above. CMOS image sensor array 100-D also includes conductors 455 that extend under passivation walls 410 and are biased by voltage source 415 to minimize cross-talk across passivation walls 410B. In addition, in accordance with a variation of the biasing conductor introduced in FIG. 4(A), conductors 455 are formed such that a plate portion extends under the pixel contact pad of each pixel and forms a capacitor with the pixel contact pad to increase pixel capacitance. For example, conductor 455A extends under passivation wall 410A, and also extends under pixel contact pad 113-1, thereby increasing the capacitance of pixel 110-D1 and improving the dynamic range of CMOS image sensor 100-D. As discussed above, the sensor charge of pixel 110-D1 is stored by the capacitance of pixel contact pad 113-1 until it is read out. A 10 micron pixel gives a capacitance of about 10 fF for a 1 micron photodiode, and can store about $2 \times 10^5$ electrons (assuming a 3V bias). As pixel sizes get smaller, the sensor dynamic range is increasingly limited by the capacitance of the smaller pixel contact pad. A larger capacitance is obtained by making the photodiode thinner, but at the expense of a higher leakage current and less sensitivity. By utilizing conductor 455A, which extends under pixel contact pad 113-1, the capacitance of pixel 110-D1 is increased over conventional structures. As discussed above with reference to FIG. 4(A), conductor 455A also provides active control over lateral leakage between pixels 110-D1 and 110-D2. Further, conductor 455A can be patterned to provide a light shield for access FET 116, which is important for the proper operation of the CMOS address circuits. Additional pixel capacity can also be made using the CMOS gate dielectric.

As suggested above, sensor materials other than conventional p-i-n a-Si:H may benefit from the cross-talk reducing structures described above. In general, these additional sensor materials will be amorphous or polycrystalline materials because single crystal materials generally cannot be grown on the surface. For example, organic sensors can be spin coated for simple deposition. A wide range of thickness is possible, by combining sensing layers with transport layers as is used in photoreceptors. Materials such as Selenium, $PbI_2$ or $HgI_2$ provide x-ray sensitivity. Alloys of a-Si:H with Ge give sensitivity in the IR, and alloys with C give UV sensitivity, as does e.g. polycrystalline GaN. The surface could also be coated with a dielectric to allow capacitative sensing.

FIG. 5 illustrates a CMOS image sensor array 100E that is generally constructed in the manner described above to include pixels 110-E1 and 110-E2 that are separated using techniques described above. In accordance with another aspect of the present invention, CMOS image sensor array 100-E includes an a-Si:H sensor layer 530 including only an undoped central region 535 and a p+doped upper region 537. That is, unlike the previously described p-i-n a-Si:H sensor structures, sensor layer 530 omits the lower n+ doped regions, and undoped central region 535 includes lower portions that enter the trenches defined by passivation walls 510 and abut the upper surfaces of pixel contacts 113-1A and 113-2A.

The lower n+ doped layer of a conventional a-Si:H sensor layer may be omitted due to the low currents generated in each pixel of a standard sized CMOS image sensor. The room temperature leakage current of a conventional a-Si:H p-i-n photodiode of about $3 \times 10^{-13}$ A/mm$^2$, which gives a current of $3 \times 10^{-17}$ A for a 10 micron pixel size. The present inventors recognized that this current is smaller than is needed for the device, particularly for video applications, and that a larger leakage current is permissible. The present inventors also recognized that the photodiode junction (i.e., the interface between the lower doped region and the pixel contact pad) is mostly determined by the p-i interface rather than the n-i interface of the sensor layer. All that is required is a bottom contact that is reasonably blocking to holes. Therefore, according to another aspect of the present invention, pixel contacts 113-1A and 113-2A are formed using Chromium or Aluminum, which have fairly low work functions and are compatible with CMOS processing. Since patterning of the n+ layer is the only fine feature lithography step required, the special p-i sensor layer of the present embodiment makes the fabrication significantly easier.

Note that CMOS image sensor array 100-E may include one or more of the above structures to further reduce cross-talk. That is, passivation walls 510 may be formed using $SiO_2$ or SiON. Further, CMOS image sensor array 100-E may include conductors 450 (described above) located below passivation walls 510 (shown in dashed lines). Moreover, CMOS image sensor array 100-E may be modified to include the texturing features described below.

In addition to reducing cross-talk between pixels, improved CMOS image sensor performance can be attained by increasing pixel sensitivity (i.e., the amount of light absorbed by each pixel). The sensitivity of conventional TFA-type CMOS image sensors is subject to the reflection of light from the surface of the biasing layer and/or transmission through the photodiode layer without interaction with the photodiode material, which reduces sensitivity because less light is able to interact with the photodiode material to produce a resulting current.

FIGS. 6(A), 6(B), and 6(C) depict a portion of a CMOS image sensor array 100-F, which represents another embodiment of CMOS image sensor 100 (FIG. 1).

Referring to FIG. 6(A), pixels 110-F of CMOS image sensor 100-E are arranged in an array of rows and columns that are generally defined by a series of first passivation walls 610-H extending in a first lateral direction, and an intersecting series of second passivation walls 610-V extending in a second lateral direction. Each pixel 110-F of CMOS image sensor 100-F is effectively isolated within the substantially square region defined by passivation walls 610-H and 610-V, which are collectively referred to below as passivation walls 610.

Referring to FIG. 6(B), similar to previously described pixel structures, each pixel 110-F includes an access FET 116 connected to a pixel contact pad 113-B by a metal via 612, a sensor layer 630 formed on passivation walls 610 and abutting an upper surface of contacts pad 113B, and a transparent biasing layer 640 formed over sensor layer 630. In accordance with another aspect of the present invention, passivation walls 610 that are patterned to provide a textured (non-planar) topology that increases light collection efficiency and, hence, the amount of light absorbed by the subsequently formed sensor layer 630. In particular, side walls 615 of passivation walls 610 are formed at an angle in the range of 45° and 60° relative to the upper surface of contact pad 113-B. In one embodiment, passivation walls 610 are created by etching one or more vias with appropriately sloped sides 615 (depending on the size of the pixel relative to the thickness of the passivation layer) through a planar passivation layer to expose the top surface of pixel contact pad 113-B. With pixel dimensions of the order 5–10 microns and passivtation layers of the order 0.6–0.9 microns, the optimal structures in today's technology would be minimum dimension vias (1×1 micron) vias on 3 micron centers. Design and control of the via etch process would be required to stop etching at the optimal point where the via is just opening and underetching of the resist is just short of joining adjacent vias under the photoresist. Alternative processes could require additional layers or thicknesses of passivation to be deposited to provide the appropriate aspect ratio for the structures. The resulting passivation walls form an inverted, truncated pyramid having sloped walls 615 that meet at centrally-located (primary) contact pad 113-B, which is connected to an access transistor as described above. One or more secondary contacts 625 (e.g., Chrome or Aluminum) may then be formed on sloped walls 615 that are connected at their lower end to primary contact pad 113-B. Sensor layer 630 is then formed on secondary contacts 625 and primary contact pad 113-B such that sensor layer 630 conforms with the underlying topology. Biasing layer 640 (e.g., ITO) is then formed over sensor layer 630, and also conforms with the underlying topology.

FIG. 6(C) is a simplified diagram illustrating the improved absorption derived by texturing sensor layer 530. In particular, FIG. 6(C) illustrates how a light beam, which is directed substantially normal to the substrate supporting CMOS image sensor array 100-F, is substantially completely absorbed by CMOS image sensor array 100-F. In particular, when uninterrupted light beam 650A strikes an upper surface of bias layer 640, a first portion 650B is absorbed, and a second portion 650C is reflected. Because of the topology of bias layer 640 (and underlying sensor layer 630), reflected beam portion 650C is directed against an opposing wall of bias layer 640 (i.e., instead of being reflected away from CMOS image sensor array 100-F). Accordingly, a first portion 650C1 of portion 650C is absorbed, and a second portion 650C2 of portion 650C is reflected. Note that light beam portions (not shown) that pass through sensor layer 630 and strike secondary contacts 625 (see FIG. 6(B)) are also reflected back through sensor layer 630, thereby increasing the chance of interaction with the sensor material. By selecting a topology carefully, the absorption of reflected light can be maximized to effectively absorb all of the light received over a given pixel, thus either improving the performance of CMOS image sensor array 100-F when compared to a similar device with identical pixel pitch, or allowing a reduced pixel size at the same performance.

As described above, the topology of CMOS image sensor array 100-F is intended to create depressions in the top surface of the sensor array that have shapes and dimensions designed to cause all light reflected from the surface of a given pixel to impinge on other parts of the same pixel until essentially all light is absorbed. The idea of using such structures to create highly light absorbing layers in the active layer of a CMOS sensor takes advantage of a unique and little know property of a-Si:H sensor materials (i.e., conformal growth), but may also provide similar performance when sensor layer 630 is formed using a p-i a-Si:H structure (as described above with reference to FIG. 5), or any other sensor material exhibiting similar light absorption characteristics.

Note also that CMOS image sensor array 100-F may include one or more of the above structures to reduce crosstalk. That is, as shown in FIG. 6(B), passivation walls 610 may be formed using SiO$_2$ or SiON. Further, CMOS image sensor array 100-F may include conductors 450 (described above) located below passivation walls 610 (shown in dashed lines).

FIG. 7 is a simplified side view showing a color image sensor 700 that includes a color filter structure 710 formed over CMOS image sensor 100, which is formed in accordance with any of the various embodiments described above. Typically, color image sensing is achieved by depositing color filters onto individual pixels of an image sensor array. The color filters pass light of a selected color, and block light of all other colors. However, the process of forming individual color filters over each pixel this is expensive as three separate deposition and etching steps are required.

In accordance with another aspect of the present invention, color filter structure 710 includes a primary lens 720 that focuses an image toward image sensor array 100. Primary lens 720 is formed with a low f-number, and therefore produces a strongly converging light pattern 725. A secondary lens set 730 is formed below primary lens 720 (i.e., between primary lens 720 and image sensor array 100) that is divided into sections, each section including a different color filter (e.g., blue 732, yellow 734, or red 736), as indicated in FIG. 7. Hence, the colors are projected onto image sensor array 100 at different angles. In addition, a mask 740 is placed above image sensor array 100 and includes apertures 745 arranged such that every pixel 110 is shadowed from two of the three colors. Lens structure 710 requires a thick transparent layer, which could be fabricated from SU8 or some other thick photoresist, and shadow mask 740, which could be fabricated from a metal, using only one lithography step. If the pixel size is 10 microns and lens 720 operates at f-2, then the thickness of the transparent layer needs to be about 30 microns, depending on its refractive index. Since the three light sources are extended, there would be some overlap in the color images. This could be removed by placing a microlens 750 at each aperture, as illustrated in FIG. 7. Microlenses 750 would not need to form a precise image, but only to allow some convergence of the light.

Although the present invention has been described with respect to certain specific embodiments, it will be clear to those skilled in the art that the inventive features of the present invention are applicable to other embodiments as well.

What is claimed is:

1. An image sensor array comprising:
   a plurality of pixels arranged in rows and columns, each pixel including a contact pad and pixel circuitry connected to the contact pad;
   a passivation layer formed between the pixel circuitry and the contact pad of each of the plurality of pixels, wherein the contact pad of each pixel is formed on a first surface of the passivation layer and connected to corresponding pixel circuitry by a via structure passing through the passivation layer;
   a plurality of passivation walls extending from the first surface of the passivation layer and defining a plurality of trenches, each trench being surrounded by corresponding sections of the plurality of passivation walls, each of the plurality of passivation walls having upper edges, wherein the contact pad of each pixel is located in an associated trench such that an upper surface of the contact pad is located between the first surface of the passivation layer and the upper edges of the passivation walls; and
   a sensor layer formed over the plurality of passivation walls and having lower portions extending into the trenches, wherein each lower portion of the sensor layer abuts the upper surface of an associated pixel contact pad.

2. The image sensor array according to claim 1, wherein the sensor layer is an amorphous silicon (a-Si:H) layer further comprising:
an upper region that is doped with a p-type dopant; and
an undoped central region that is located between the upper region and the lower portions,
wherein the lower portions of the a-Si:H layer that are doped with an n-type dopant, and
wherein the passivation walls extend into the central, relatively undoped region of the a-Si layer.

3. The image sensor array according to claim 1, further comprising a conductor formed below each of the passivation walls, wherein the conductor is connected to a low voltage source such that the conductor generates a field that impedes the flow of electrons from a metal contact pad of a first pixel to a metal contact pad of a second pixel via the passivation wall.

4. The image sensor array according to claim 3, wherein portions of selected conductors extend under the contact pad of associated pixels such that a capacitor is formed by each portion and the contact pad of the associated pixel.

5. The image sensor array according to claim 1,
wherein the sensor layer is an amorphous silicon (a-Si:H) layer further comprising an upper region that is doped with a p-type dopant, and a central region that is located between the upper region and the lower portions, and
wherein the central region and the lower portions of the a-Si:H layer are undoped.

6. The image sensor array according to claim 1, wherein side surfaces of the passivation walls are sloped such that the lower portion of the a-Si:H layer forms an angle in the range of 45° and 60° relative to the upper surface of the contact pad.

7. The image sensor array according to claim 6, further comprising a conductor formed below each of the passivation walls, wherein the metal structure is connected to a low voltage source such that the metal structure generates a field that impedes the flow of electrons from a metal contact pad of a first pixel to a metal contact pad of a second pixel via the passivation wall.

8. The image sensor array according to claim 6, wherein the passivation walls are formed from a material selected from the group consisting of SiO$_2$, SiON, and benzocyclobutene (BCB).

9. A image sensor array comprising:
a plurality of pixels including a first pixel having a first contact pad and a second pixel having a second contact pad that is separated from the first contact pad by an elongated interface region, wherein the first pixel further includes pixel circuitry located below the first contact pad, the pixel circuitry;
a continuous sensor layer formed over the plurality of pixels and having lower portions contacting the first and second contact pads, respectively; and
a plurality of conductors including a first conductor located between the pixel circuitry and the first contact pad and extending under the interface region separating the first and second contact pads,
wherein the plurality of conductors are connected to a low voltage source such that the first conductor generates a field that impedes the flow of electrons across the interface region from the first contact pad of the first pixel to the second contact pad of the second pixel.

10. The image sensor array according to claim 9, wherein the first conductor further comprises a portion extending under the first contact pad such that a capacitor is formed by the portion and the first contact pad.

11. The image sensor array according to claim 9, further comprising a passivation layer including portions provided in the interface region separating the first and second contact pads.

12. The image sensor according to claim 11,
wherein the passivation layer defines a plurality of trenches and the portions of the passivation layer comprise passivation walls surrounding the trenches, each of the passivation walls having upper edges, and
wherein the first contact pad is located in a first trench and the second contact pad is located in a second trench adjacent to the first trench such that a first passivation wall is located between the first contact pad and the second contact pad, and such that the upper surfaces of the first and second contact pads are located below the upper edge of the first passivation wall.

13. The image sensor array according to claim 12, wherein the passivation walls are formed from a material selected from the group consisting of SiO$_2$, SiON, and benzocyclobutene (BCB).

14. The image sensor array according to claim 12, wherein the passivation walls are sloped such that the lower portions of the central region of the continuous sensor layer define an angle in the range of 45° and 60° relative to the upper surface of the contact pad.

15. The image sensor array according to claim 9, wherein the continuous sensor layer is an amorphous silicon (a-Si:H) layer further comprising:
an upper region that is doped with a p-type dopant; and
an undoped central region that is located between the upper region and the lower portions,
wherein the lower portions of the a-Si:H layer that are doped with an n-type dopant, and
wherein the passivation walls extend into the central, relatively undoped region of the a-Si:H layer.

16. The image sensor array according to claim 9,
wherein the continuous sensor layer is an amorphous silicon (a-Si:H) layer further comprising an upper region that is doped with a p-type dopant, and a central region that is located between the upper region and the lower portions, and
wherein the central region and the lower portions of the a-Si:H layer are undoped.

* * * * *